(12) United States Patent
Zhu et al.

(10) Patent No.: US 7,670,896 B2
(45) Date of Patent: Mar. 2, 2010

(54) METHOD AND STRUCTURE FOR REDUCING FLOATING BODY EFFECTS IN MOSFET DEVICES

(75) Inventors: Huilong Zhu, Poughkeepsie, NY (US); Qingqing Liang, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 387 days.

(21) Appl. No.: 11/560,412

(22) Filed: Nov. 16, 2006

(65) Prior Publication Data

US 2008/0116514 A1 May 22, 2008

(51) Int. Cl.
*H01L 21/8238* (2006.01)

(52) U.S. Cl. .................... 438/233; 438/151; 257/382; 257/621; 257/774

(58) Field of Classification Search .................. 257/347, 257/228, E21.04, 621, 774; 438/157, 523, 438/233, 533, 620
See application file for complete search history.

(56) References Cited

U.S. PATENT DOCUMENTS

| | | | |
|---|---|---|---|
| 5,160,989 A | 11/1992 | Houston | |
| 5,245,208 A * | 9/1993 | Eimori | 257/344 |
| 5,844,285 A | 12/1998 | Kwon | |
| 5,882,981 A * | 3/1999 | Rajgopal et al. | 438/404 |
| 5,929,490 A | 7/1999 | Onishi | |
| 5,935,766 A * | 8/1999 | Cheek et al. | 430/316 |
| 5,962,895 A | 10/1999 | Beyer et al. | |
| 6,160,291 A * | 12/2000 | Imai | 257/347 |
| 6,387,739 B1 | 5/2002 | Smith, III | |
| 6,441,435 B1 * | 8/2002 | Chan | 257/347 |
| 6,724,048 B2 | 4/2004 | Min et al. | |
| 6,790,750 B1 | 9/2004 | Long et al. | |
| 2004/0188760 A1 * | 9/2004 | Skotnicki et al. | 257/347 |
| 2004/0238889 A1 * | 12/2004 | Gonzalez et al. | 257/347 |

* cited by examiner

*Primary Examiner*—A. Sefer
*Assistant Examiner*—Allen L Parker
(74) *Attorney, Agent, or Firm*—Cantor Colburn LLP; Ian MacKinnon

(57) ABSTRACT

A field effect transistor (FET) device includes a bulk substrate, a gate insulating layer formed over the bulk substrate, source and drain regions formed in an active device area associated with the bulk substrate, the source and drain regions each defining a p/n junction with respect to a body region of the active device area, and a conductive plug formed within a cavity defined in the source region, across the p/n junction of the source region and into the body region, wherein the conductive plug facilitates a discharge path between the body region and the source region.

2 Claims, 20 Drawing Sheets

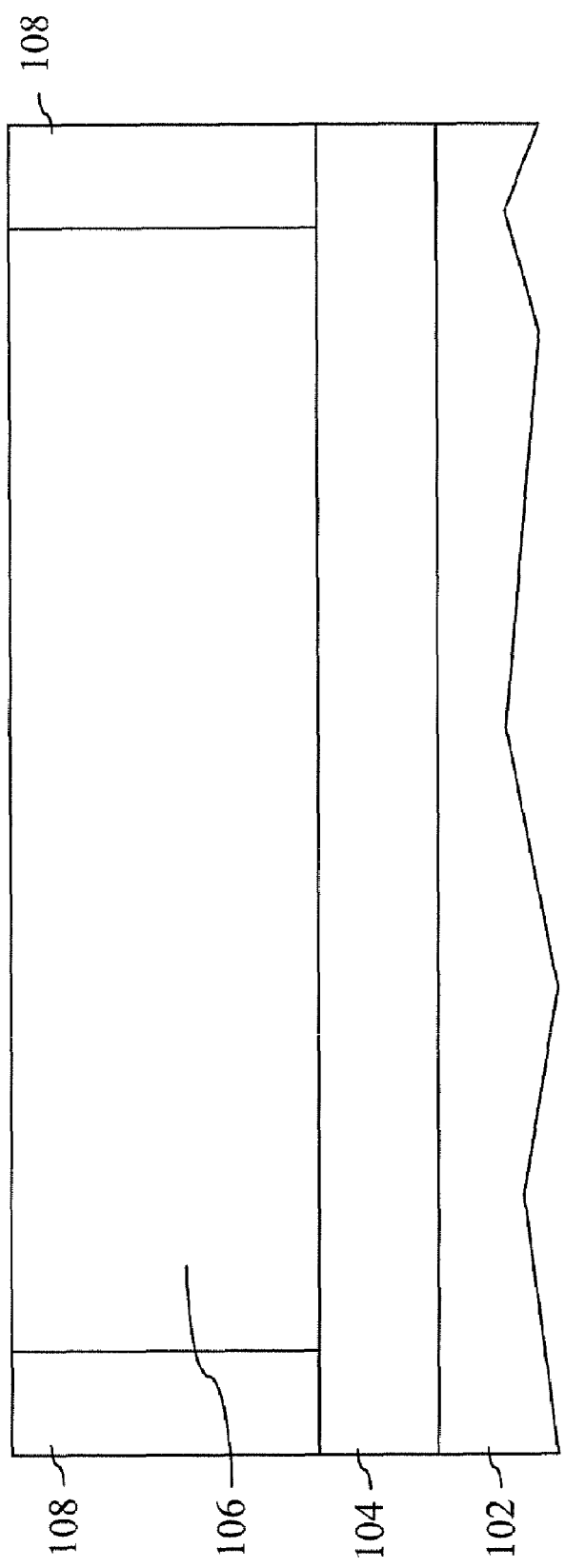

METHOD AND STRUCTURE FOR REDUCING FLOATING BODY EFFECTS IN MOSFET DEVICES

BACKGROUND

The present invention relates generally to semiconductor device processing techniques and, more particularly, to a method and structure for reducing floating body effects in metal oxide semiconductor field effect transistor (MOSFET) devices, including silicon-on-insulator (SOI) devices.

Demands for increased performance, functionality and manufacturing economy for integrated circuits have resulted in extreme integration density in order to reduce signal propagation time and increase noise immunity, while also increasing the number of circuits and devices that can be formed on a chip or wafer by a single sequence of processes. Scaling of devices to such small sizes has also restricted operating margins and has necessitated an increased uniformity of electrical characteristics of semiconductor devices formed on a chip.

To satisfy this latter criterion, silicon-on-insulator (SOI) wafers have been used to exploit the improved quality of monocrystalline silicon through an active layer thereof formed on an insulator over a bulk silicon "handling" substrate. Similar attributes may be developed in similar structures of other types of semiconductor materials and alloys thereof. The improved quality of the semiconductor material of the active SOI layer allows transistors and other devices to be scaled to extremely small sizes with good uniformity of electrical properties.

Unfortunately, the existence of the insulator layer (also referred to a buried oxide layer, or BOX) which supports the development of the improved quality of semiconductor material also presents a problem known in the art as the "floating body effect" in transistor structures. The floating body effect is specific to transistors formed on substrates having an insulator layer. In particular, the neutral floating body is electrically isolated by source/drain extension and halo regions that form oppositely poled diode junctions at the ends of the transistor conduction channel and floating body, while the gate electrode is insulated from the conduction channel through a dielectric. The insulator layer in the substrate completes insulation of the conduction channel and thus prevents discharge of any charge that may develop in the floating body. Charge injection into the neutral body when the transistor is not conducting develops voltages in the conduction channel in accordance with the source and drain diode characteristics.

The floating body effect is induced by the excess carriers generated by hot electrons near the strongly filed gradient drain region, resulting in the enhancement in the body potential in SOI devices. It induces a threshold voltage reduction, resulting in a kink in output characteristics. The voltage developed due to charge collection in the transistor conduction channel has the effect of altering the switching threshold of the transistor. This effect, in turn, alters the signal timing and signal propagation speed, since any transistor will have a finite slew rate and the rise and fall time of signals is not instantaneous even when the uniformity of threshold voltage is not good crossing a given electric circuit. SOI switching circuits, in particular, suffer from severe dynamic floating body effects such as hysteresis and history effects. The onset of the kink effect in SOI switching circuits strongly depends on operating frequency, and produces Lorentzian-like noise overshoot and harmonic distortion. Soft error issues are also more serious in SOI MOSFET devices.

In order to limit the charge that builds up in the floating body, a body contact may be incorporated into the device. However, this approach adversely affects the density of the device. Alternatively, the diode characteristics of the source and drain may be tailored. For example, floating body charge may be reduced by decreasing the potential barrier between source/drain and body junctions, such as by creating implant defects at the p/n junctions, which is a frequency independent approach. Unfortunately, as opposed to source diode leakage in a switching device, drain diode leakage increases the thermal power dissipated by a circuit, and reduces actual switching current resulting in lower speed.

Accordingly, it would be desirable to be able to reduce floating body effects (in both SOI devices and bulk silicon devices) in a manner that does not result in increased drain leakage current, reduced integrated circuit density, increased thermal power or speed reduction of the circuit.

SUMMARY

The foregoing discussed drawbacks and deficiencies of the prior art are overcome or alleviated by a field effect transistor (FET) device, including a bulk substrate, a gate insulating layer formed over the bulk substrate, source and drain regions formed in an active device area associated with the bulk substrate, the source and drain regions each defining a p/n junction with respect to a body region of the active device area, and a conductive plug formed within a cavity defined in the source region, across the p/n junction of the source region and into the body region, wherein the conductive plug facilitates a discharge path between the body region and the source region.

In another embodiment, a method for forming a field effect transistor (FET) device includes forming a gate insulating layer formed over a bulk substrate; forming source and drain regions in an active device area associated with the bulk substrate, the source and drain regions each defining a p/n junction with respect to a body region of the active device area; and forming a conductive plug formed within a cavity defined in the source region, across the p/n junction of the source region and into the body region; wherein the conductive plug facilitates a discharge path between the body region and the source region.

In still another embodiment, a method for reducing floating body effects in a silicon-on-insulator (SOI) field effect transistor (FET) device includes forming a buried insulator layer over a bulk substrate; forming a silicon-on-insulator (SOI) layer over the buried insulator layer; forming a gate insulating layer formed over the SOI layer; forming source and drain regions within the SOI layer, the source and drain regions each defining a p/n junction with respect to a body region of an active device area within the SOI layer; and forming a conductive plug formed within a cavity defined in the source region, across the p/n junction of the source region and into the body region, wherein the cavity and the plug extend laterally across the source region, in a direction toward the drain region, and across the p/n junction of the source region and into the body region above the buried insulator layer; wherein the conductive plug facilitates a discharge path between the body region and the source region.

BRIEF DESCRIPTION OF THE DRAWINGS

Referring to the exemplary drawings wherein like elements are numbered alike in the several FIGS:

FIGS. 1(a) through 1(k) are a sequence of cross sectional views of a method and structure for reducing floating body effects in silicon-on-insulator (SOI) transistor devices, in accordance with an embodiment of the invention.

DETAILED DESCRIPTION

Disclosed herein is a method and structure for reducing floating body effects in MOSFET devices, including silicon-on-insulator (SOI) type devices, without junction leakage. Briefly stated, the embodiments disclosed herein provide for a metal plug formed through the source region of the transistor device, such that the plug extends into the body of the transistor and providing a short between the source and body.

Figure 1B:
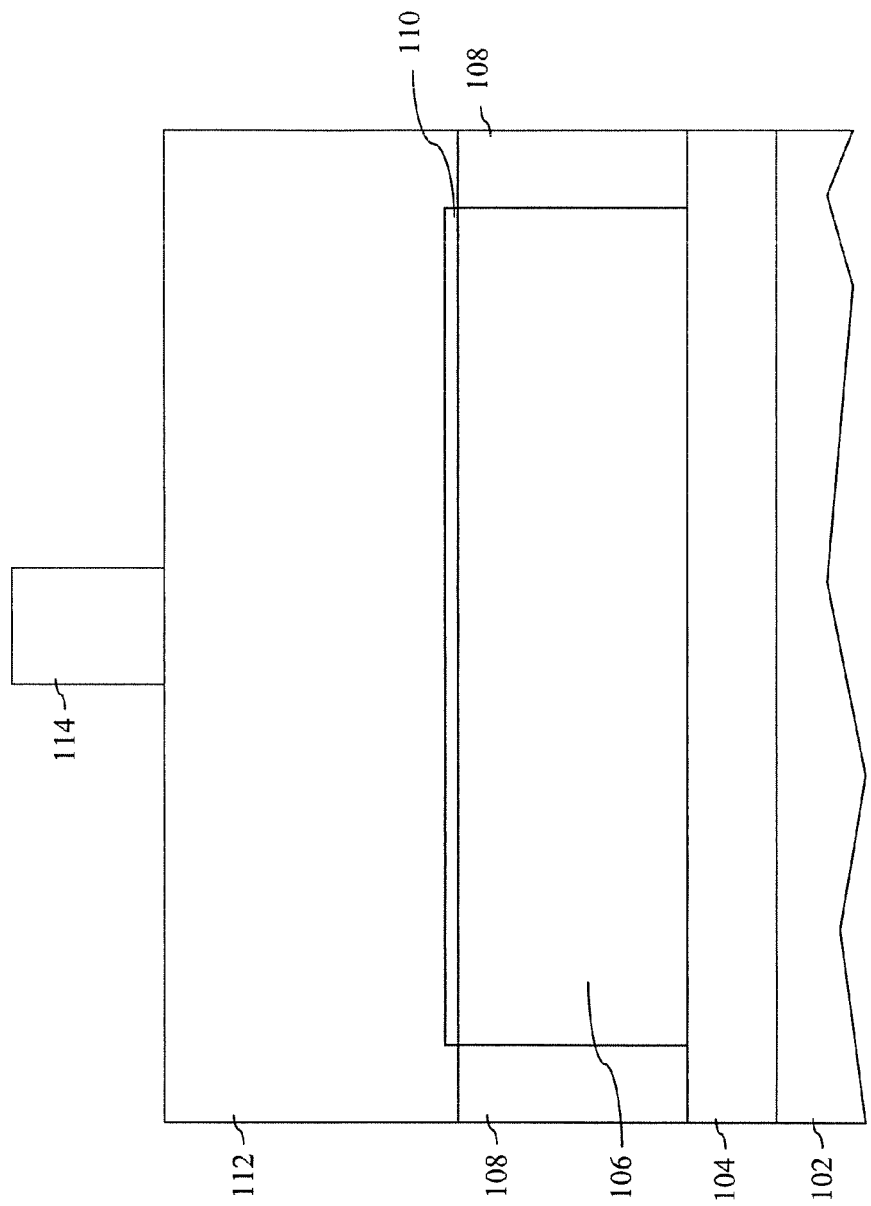
Figure 1C:
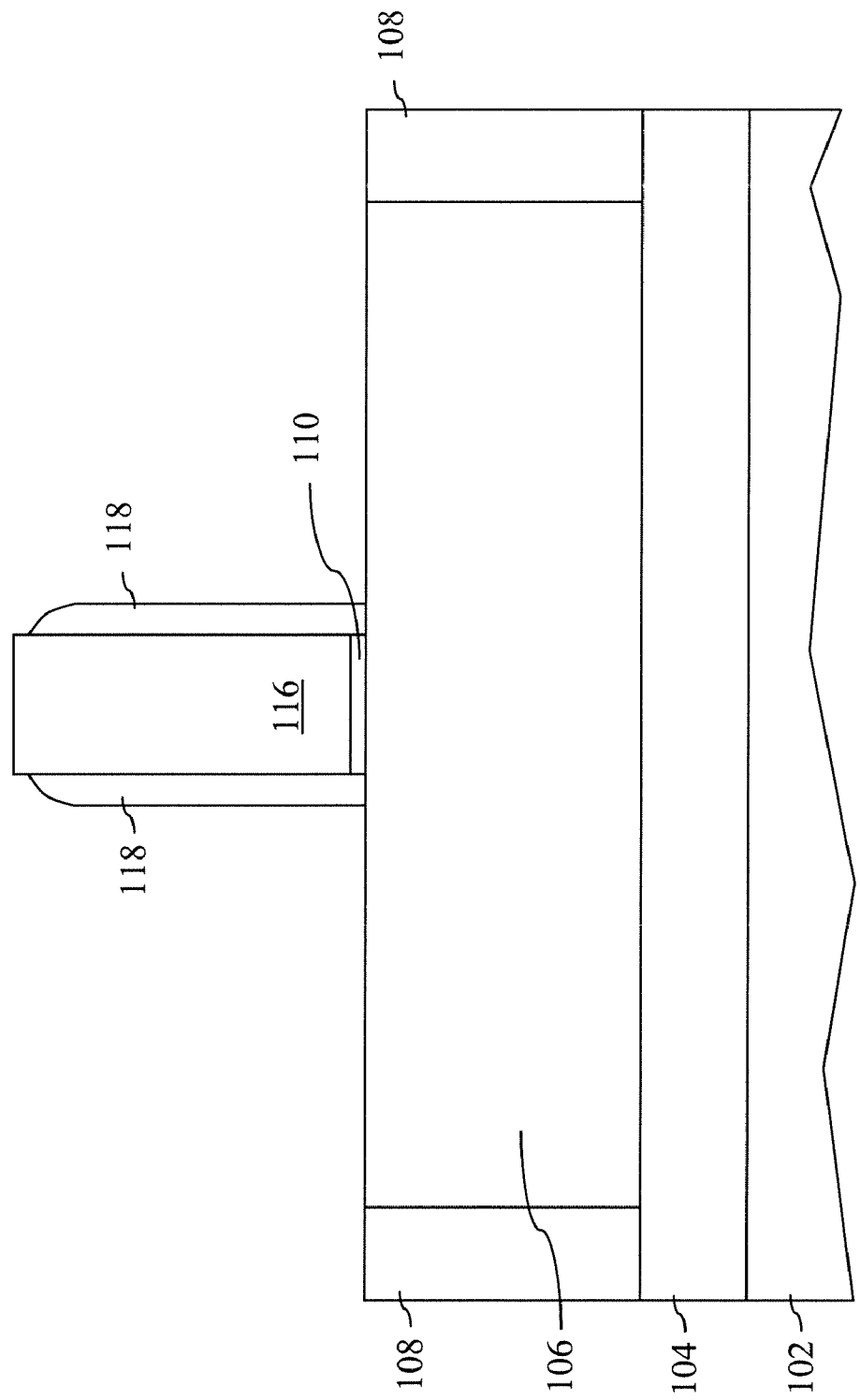

Referring initially to FIGS. 1(a) through 1(k), there is shown a sequence of cross sectional views of a method and structure for reducing floating body effects in a silicon-on-insulator (SOI) transistor device, in accordance with an embodiment of the invention. As shown in FIG. 1(a), a bulk silicon layer 102 has a buried insulator (e.g., oxide) layer (BOX) 104 formed thereon. A crystalline silicon layer 106 is in turn formed over the BOX layer 104; thus, the term silicon-on-insulator (SOI) is also used to describe layer 106, in which active transistor devices are formed therein. In an exemplary embodiment, the SOI layer 106 (e.g., for an N-type device) may be a P-type layer of relatively low dopant concentration (e.g., about $1 \times 10^{17}$ atoms/cm$^3$). As also illustrated in FIG. 1(a), shallow trench isolation (STI) regions 108 are formed in order to electrically isolate the subsequently formed transistor in SOI layer 106 from other devices.

In FIG. 1(b), a thermal oxide layer 110 (e.g., on the order of about 1-5 nm in thickness) is formed over the SOI layer 106, and is used as the gate insulator material. Other gate insulating materials could also be used, however. Then, a polysilicon layer 112 (e.g., on the order of about 100-200 nm in thickness) is formed over the gate oxide layer 110, followed by a patterned photoresist material 114, which defines the gate electrode structure. As next shown in FIG. 1(c), the photoresist pattern is transferred into the polysilicon layer 112 to form a gate electrode 116, after which oxide sidewall spacers 118 are formed on the gate sidewalls as is known in the art.

Figure 1D:
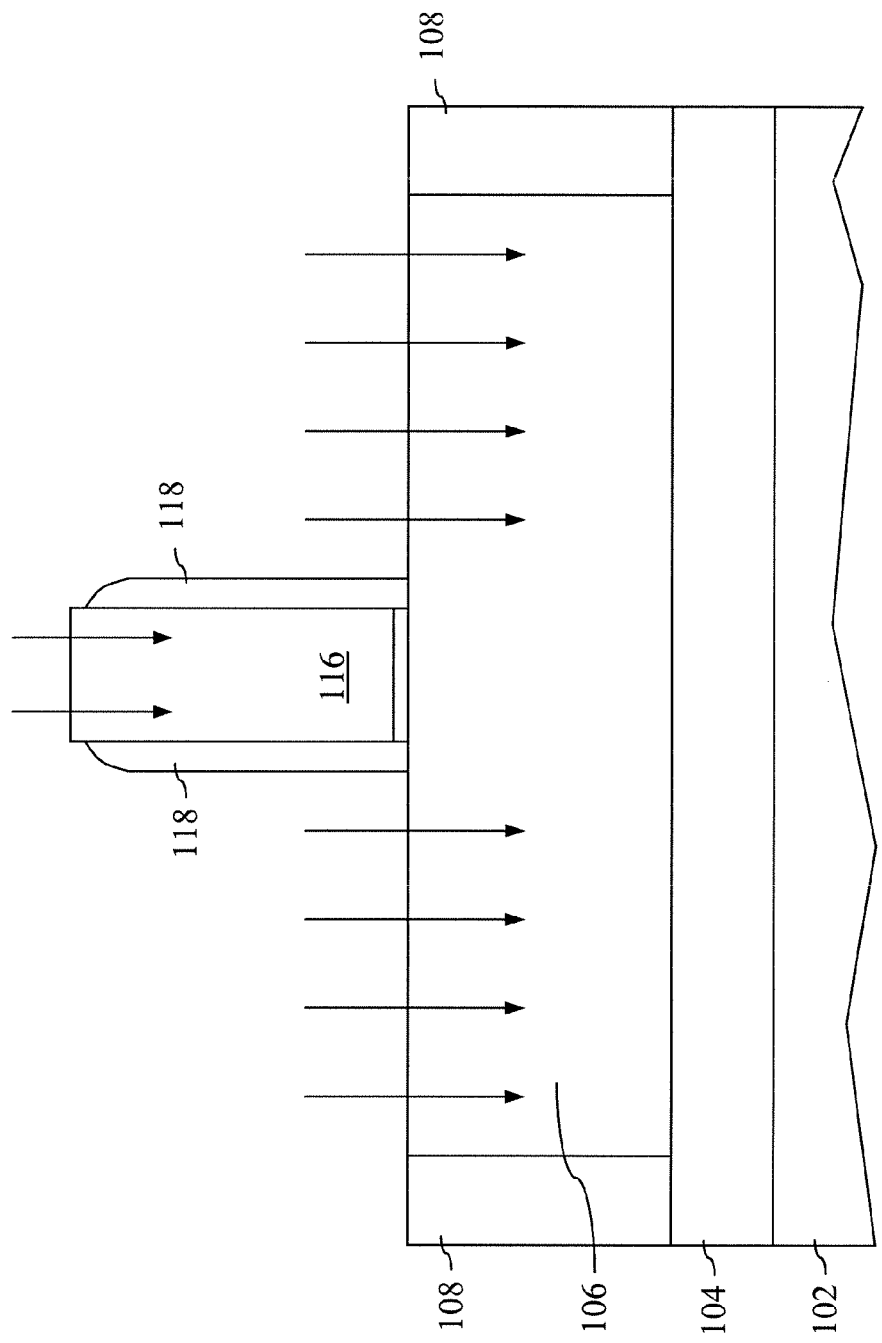
Figure 1E:
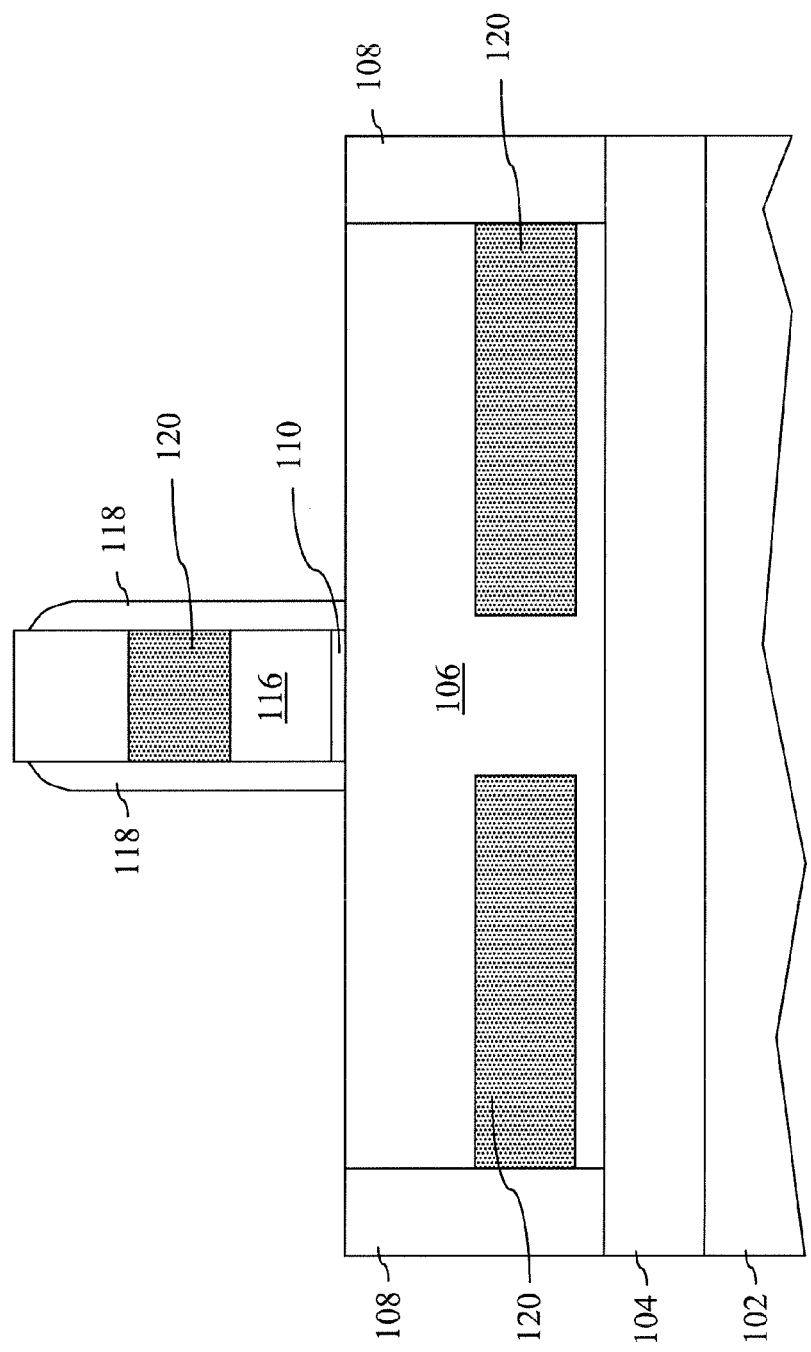
Figure 1F:
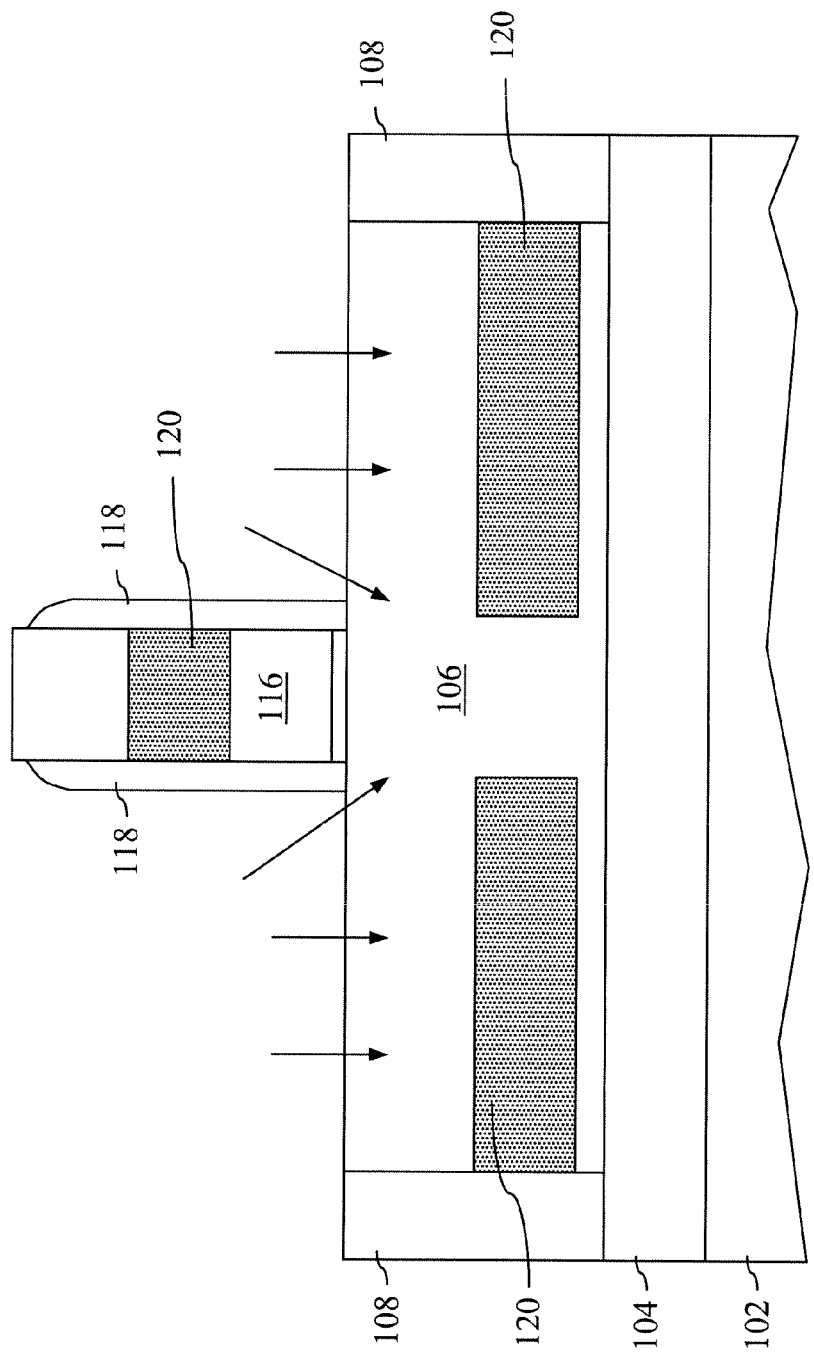

Referring to FIG. 1(d), the device is then subjected to an implant of germanium (Ge), or other suitable neutral species that results in a region having etch selectivity with respect to silicon. The purpose of the neutral implant is described in further detail hereinafter. A high temperature anneal is then used to repair the implant damage of the silicon, leaving SiGe regions 120 as shown in FIG. 1(e). Continuing to FIG. 1(f), halo (angled arrows) and extension (vertical arrows) implants are carried out in accordance with FET source/drain formation techniques.

Figure 1G:
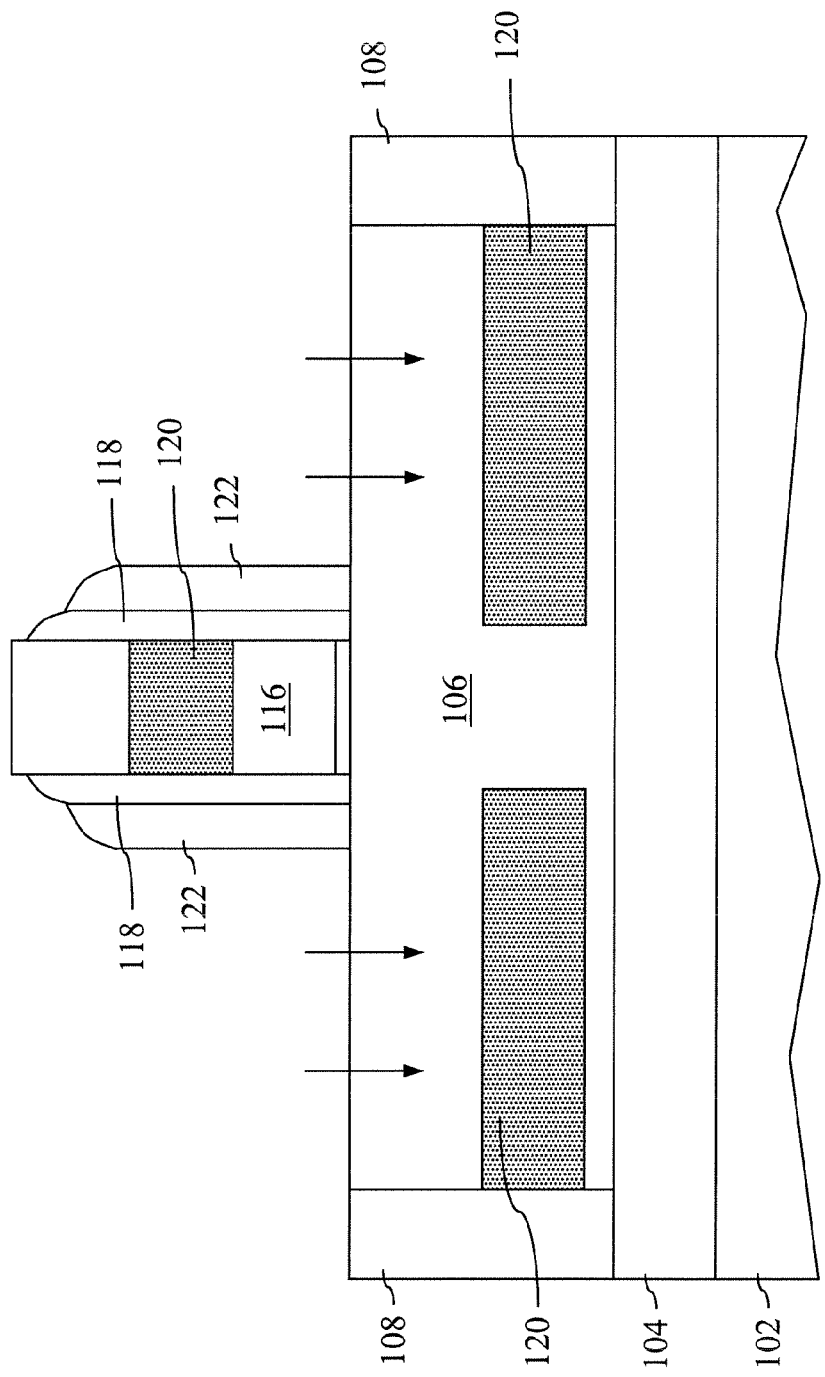
Figure 1H:
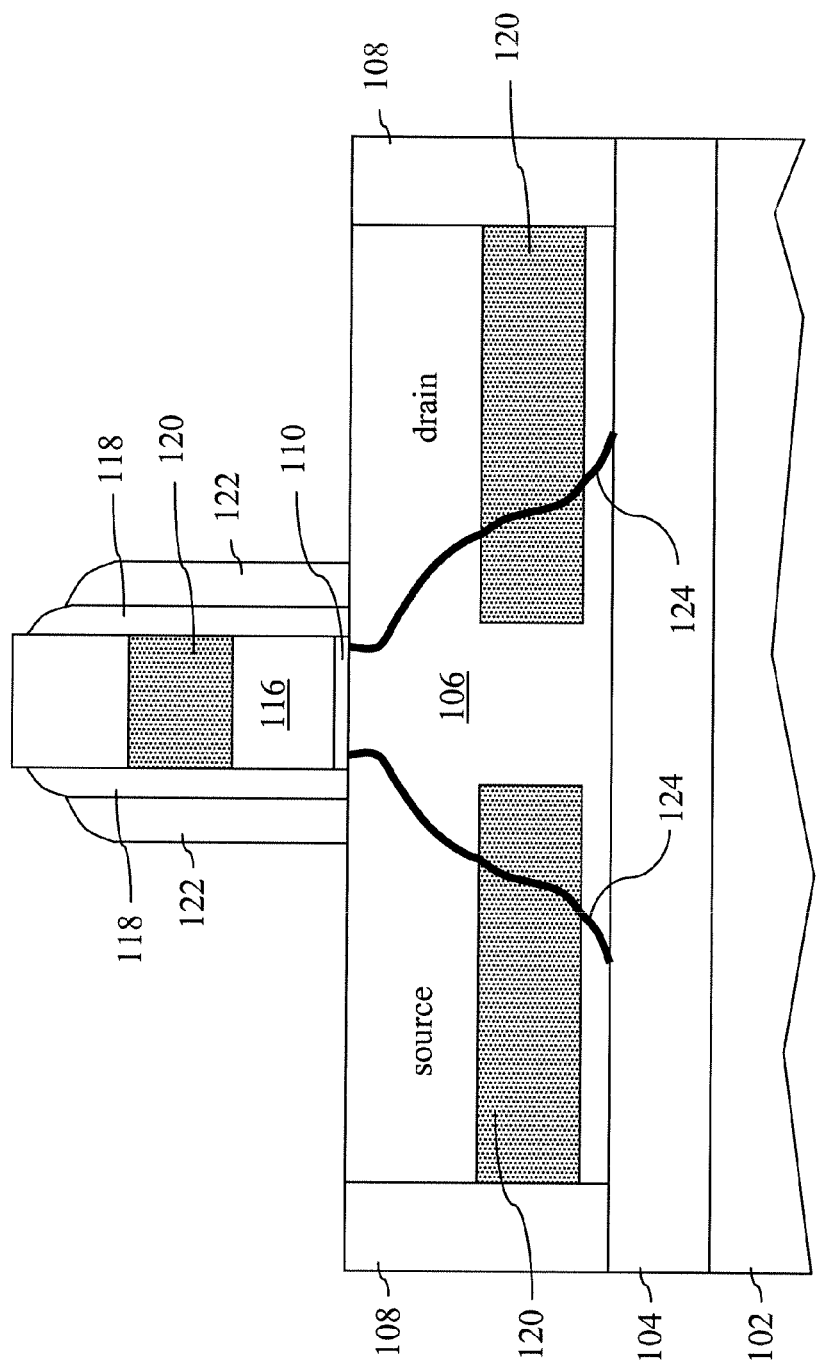
Figure 1I:
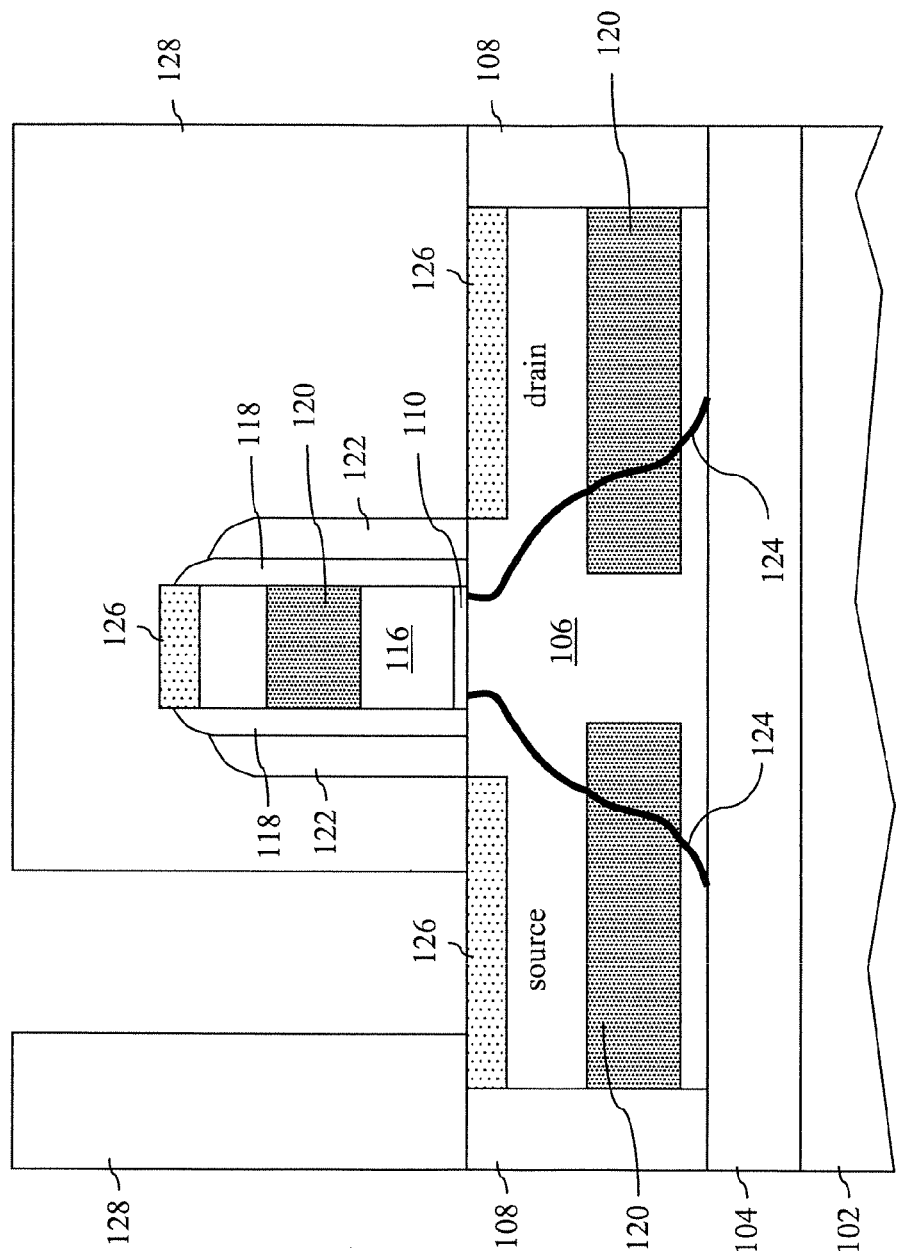

As then shown in FIG. 1(g), a second set of sidewall spacers 122 (e.g., nitride) is formed adjacent spacers 118 as is known in the art so that the deep source/drain implants may be formed. Following another anneal to activate the source and drain dopants, p/n junctions 124 are then defined between the source/drain regions and the body 106, as depicted in FIG. 1(h). Proceeding to FIG. 1(i), silicide contacts 126 are then formed over the gate 116, as well as the source and drain regions in a manner known in the art. For example, a silicide forming metal such as nickel is formed over the structure, followed by an anneal (e.g., at about 300° C. to about 500° C.) to form NiSi. Thereafter, the unreacted nickel over insulating regions is removed by wet etching. However, after silicidation, a photoresist layer 128 is then formed over the device, and patterned in a manner so as to expose the source area of the device as further shown in FIG. 1(i). Optionally, a thin nitride layer (not shown) can be formed after silicidation to protect the NiSi contacts and device from moisture and mobile ions. This thin nitride layer also acts as an etch stopper during conventional etching of contact holes. However, the optional nitride layer is not, per se, related to the present invention embodiments.

Figure 1J:
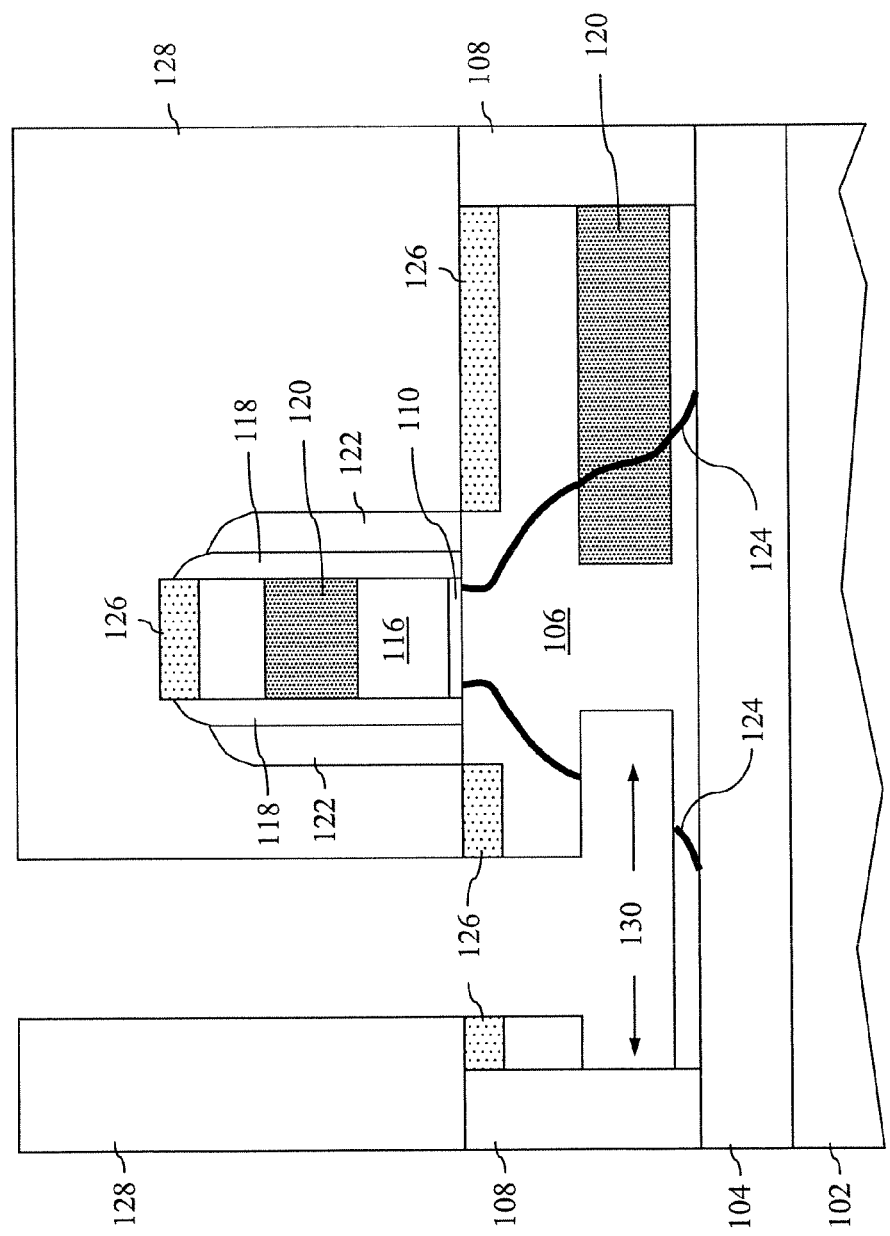

Referring to FIG. 1(j), a multiple step etch is used to remove first the source side NiSi, followed by the doped silicon in the source region, and thereafter the source side SiGe region 120. In particular, the SiGe region is selectively etched in an isotropic manner so as to etch the material in a lateral direction, creating cavity 130. It will be noted that the cavity 130 (and thus the originally formed SiGe region) extends across the p/n junction on the source side and into the SOI body 106. It will also be noted that the SiGe regions 120 in the drain side of the device and in the gate 116 are unaffected by the etch and remain in the device. Alternatively, the device could be patterned so as to protect the gate and drain regions prior to the Ge implant in FIG. 1(d).

Figure 1K:
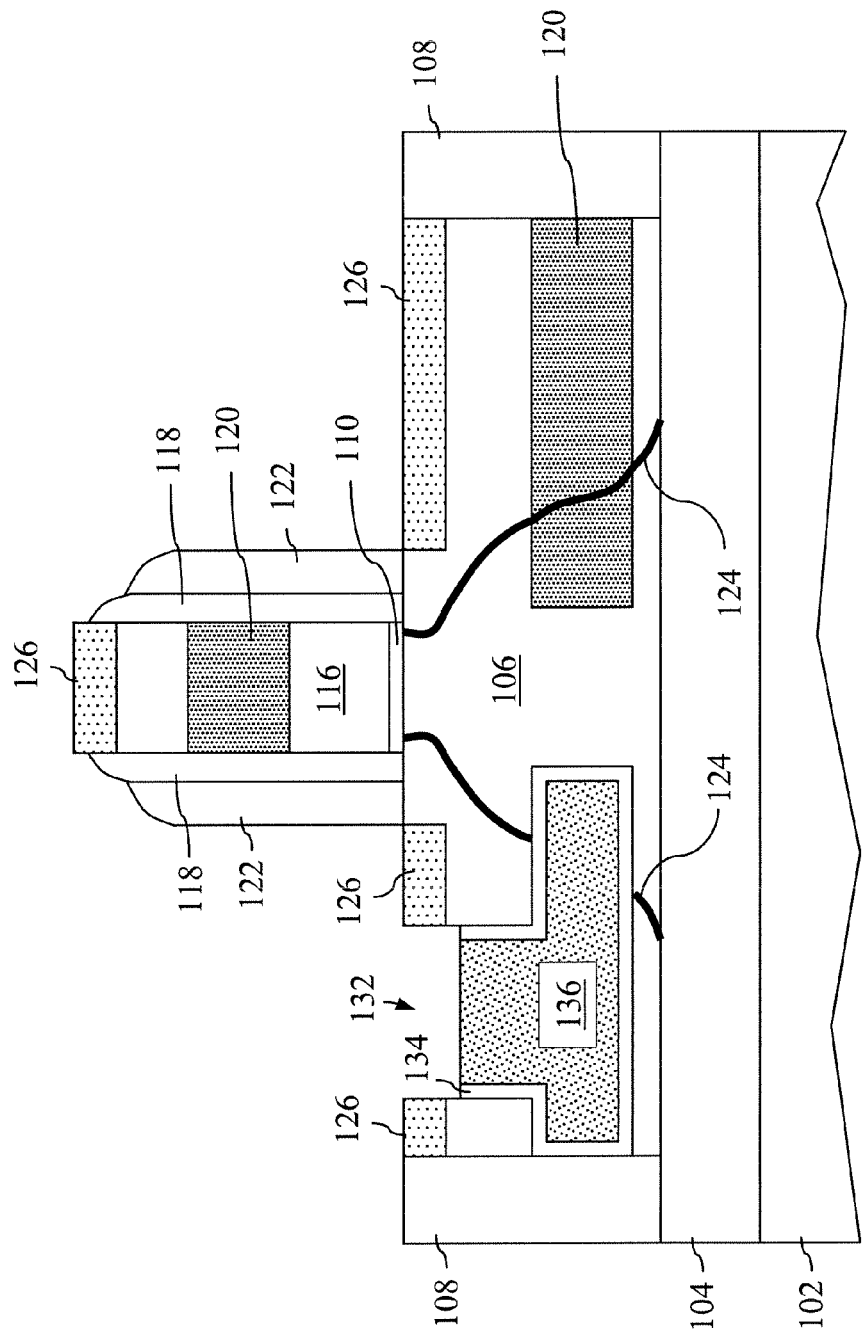

In either instance, a metal plug 132 is then formed within the cavity 130 after removal of the photoresist 128, as shown in FIG. 1(k). In an exemplary embodiment, the plug formation is carried out in a similar manner to that of metal via formation in the upper wiring levels of a semiconductor device. For example, a thin titanium nitride (TiN) liner layer 134 is conformally deposited within the source side cavity 130, followed by a deposition and etch-back of a metal plug material 136 such as tungsten (W) to complete the plug 132. Thus configured, the plug 132 provides a source-to-body contact that conducts excess body charge to the source terminal (which is typically connected to ground for an NFET device). Following the formation of the plug 132, conventional processing may continue to complete the device (e.g., interlevel dielectric layer formation, via/line formation and other back end of line processes).

Because of the relatively shallow depth of the SOI layer 106 with respect to the source and drain regions, the doped Ge layer 120 is used to create a lateral etch profile such that the plug 132 is able to extend laterally in the direction of the channel of the device and thus bridge over the p/n junction 124 and into the body region. However, for bulk silicon devices not having a buried insulator layer, source-to-body plugs may also be formed to reduce floating body effects. Further, without the presence of a BOX layer, the plug formation process becomes more simplified in that a lateral etch profile is not needed since the plug may be formed in a downward direction to bridge the source side p/n junction.

Figure 2A:
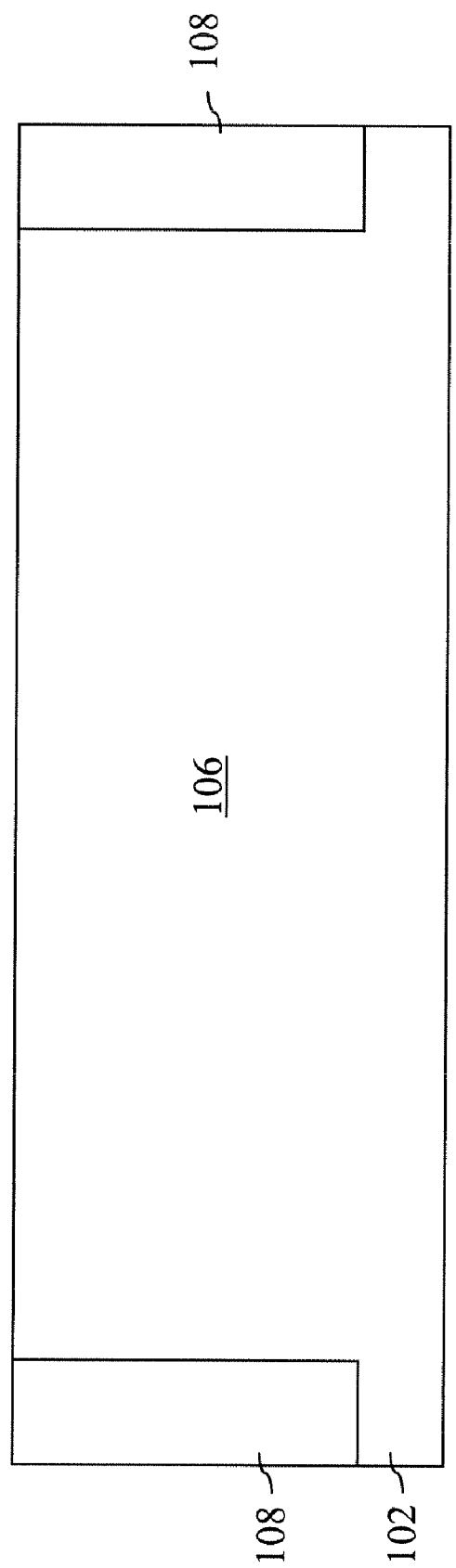
FIGS. 2(a) through 2(i) are a sequence of cross sectional views of a method and structure for reducing floating body effects in bulk silicon transistor devices, in accordance with an alternative embodiment of the invention.

Accordingly, FIGS. 2(a) through 2(i) are a sequence of cross sectional views of a method and structure for reducing floating body effects in bulk silicon transistor devices, in accordance with an alternative embodiment of the invention. For purposes of simplicity, like elements are designated with the same reference numerals with respect to the embodiment in FIG. 1. As shown in FIG. 2(a), a bulk silicon layer 102 (without a buried insulating layer) has STI regions 108 formed therein in order to electrically isolate the subsequently formed transistor in a body region 106 of the substrate 102 from other devices.

Figure 2B:
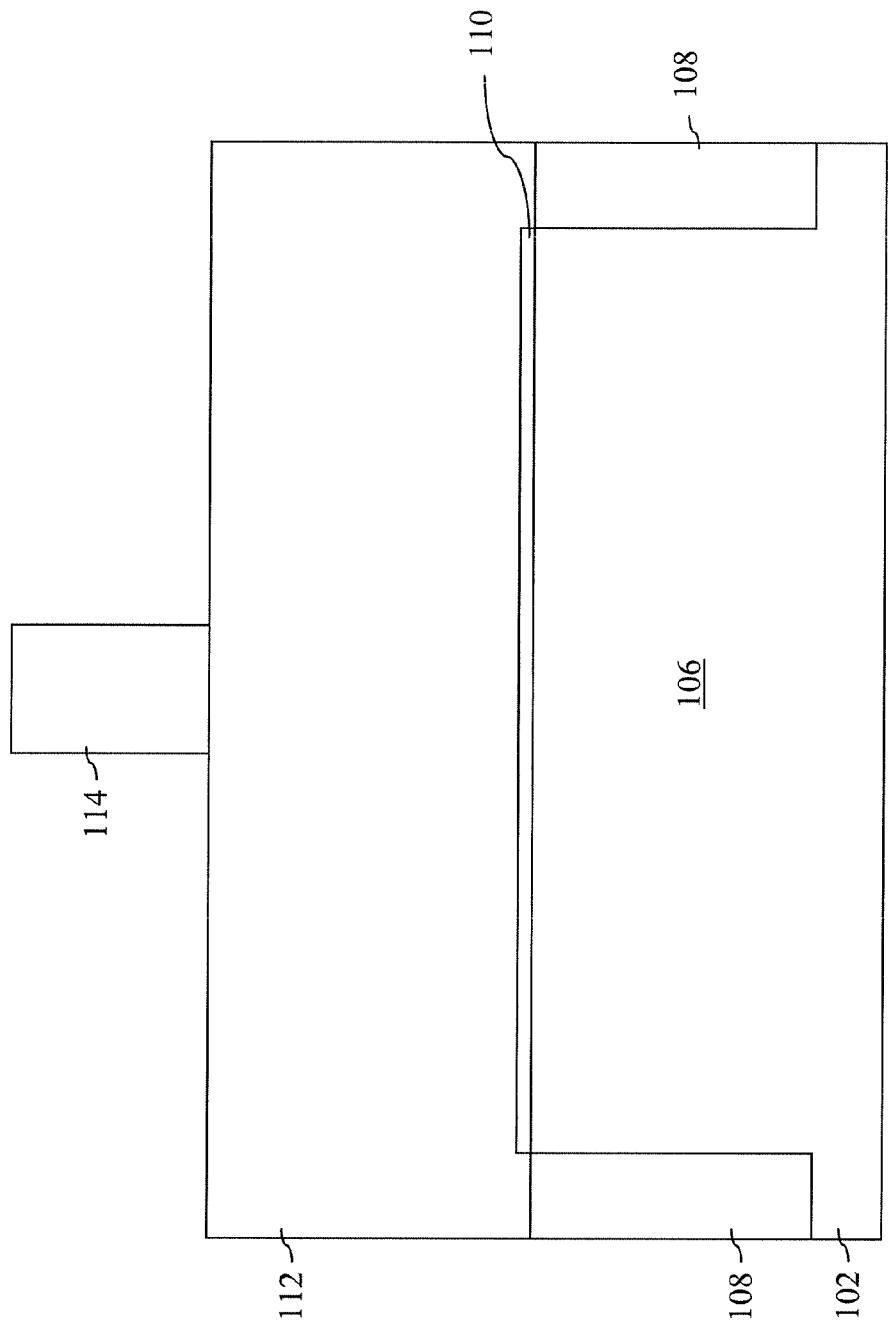
Figure 2C:
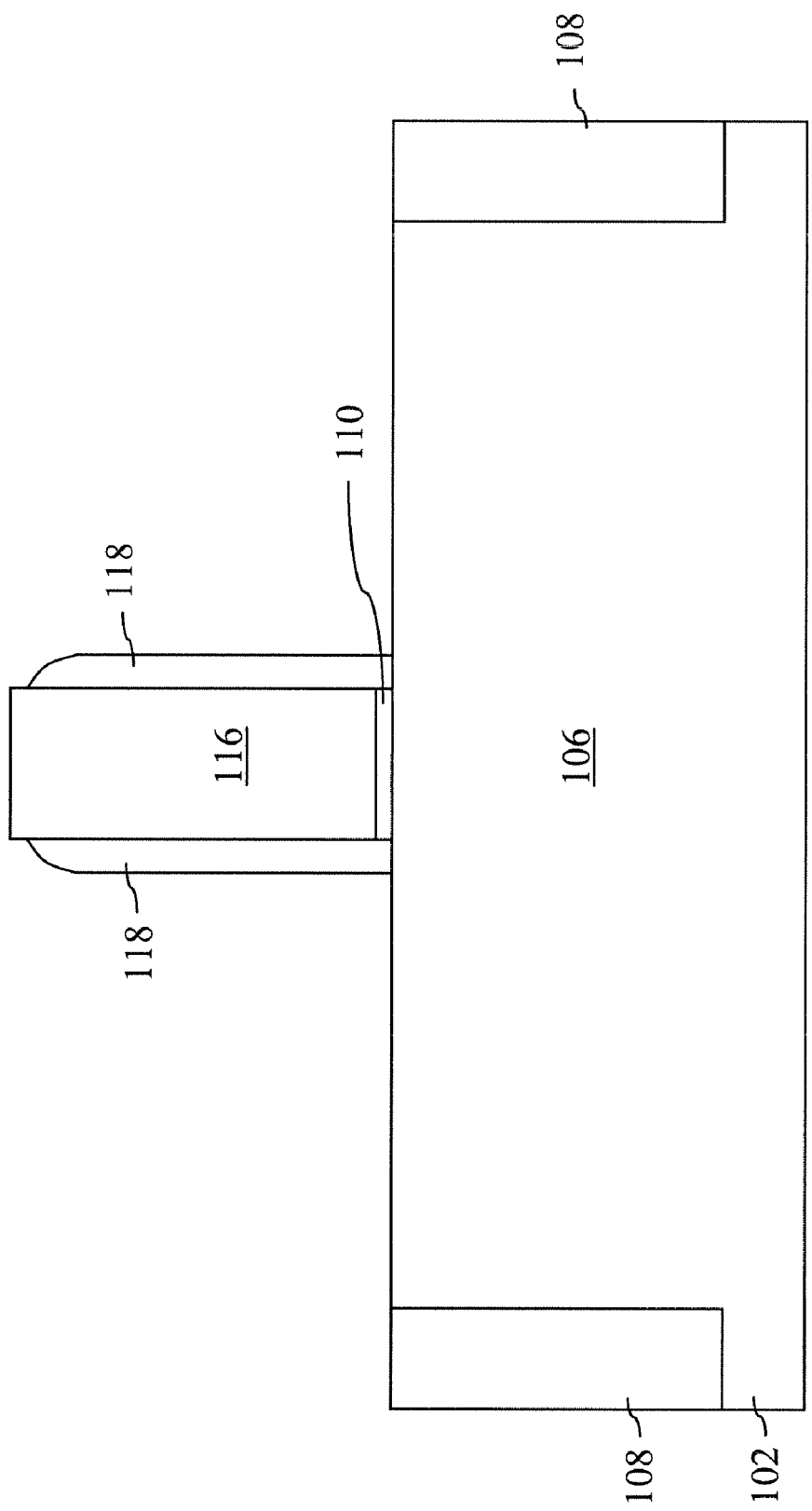

Similar to FIG. 1(b), FIG. 2(b) illustrates the formation of a thermal oxide layer 110 (e.g., on the order of about 1-5 nm in thickness) is formed over the bulk substrate 102, which is used as the gate insulator material. Again, other gate insulating materials could also be used, however. Then, a polysilicon layer 112 (e.g., on the order of about 100-200 nm in thickness) is formed over the gate oxide layer 110, followed by a patterned photoresist material 114, which defines the gate electrode structure. As next shown in FIG. 2(c), the photoresist pattern is transferred into the polysilicon layer 112 to form a gate electrode 116, after which oxide sidewall spacers 118 are formed on the gate sidewalls as is known in the art.

Figure 2D:
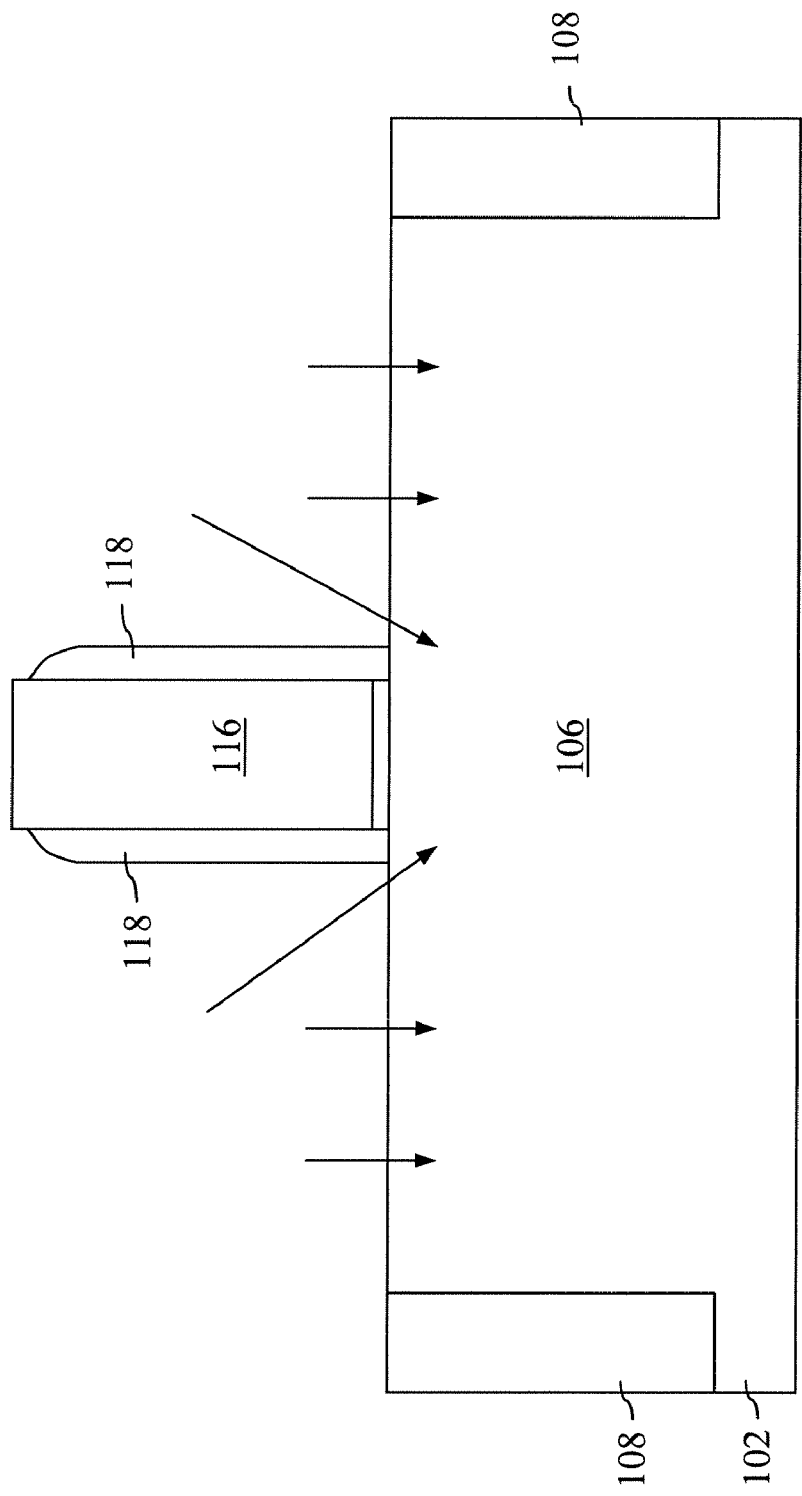
Figure 2E:
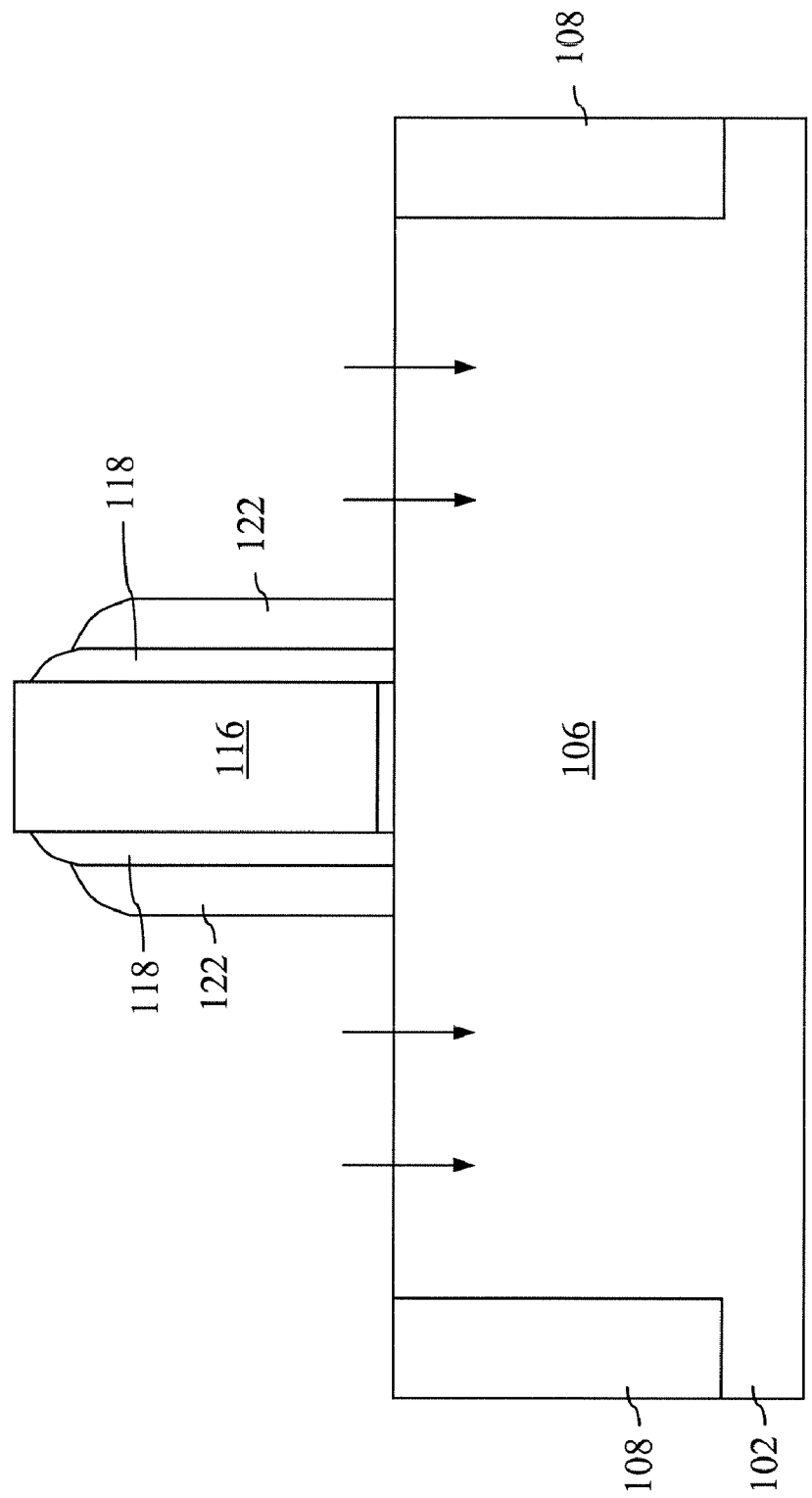
Figure 2F:
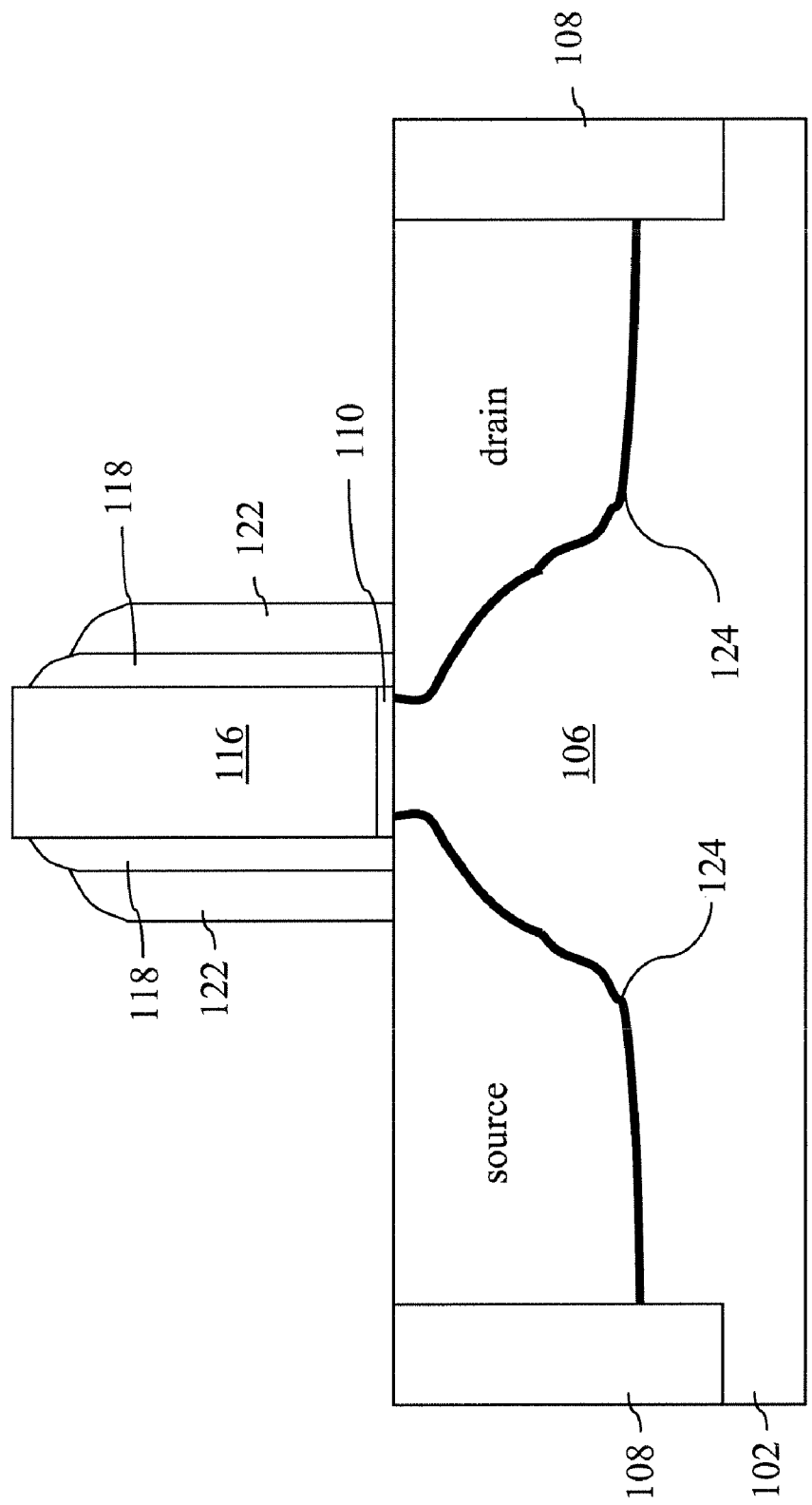

However, whereas the SOI embodiment of FIG. 1(d) implements the use of a neutral species (Ge) implantation, the bulk silicon embodiment of FIG. 2(d) proceeds directly to halo (angled arrows) and extension (vertical arrows) implants carried out in accordance with FET source/drain formation techniques. As then shown in FIG. 2(e), a second set of sidewall spacers 122 (e.g., nitride) is formed adjacent spacers 118 as is known in the art so that the deep source/drain implants may be formed. Following another anneal to activate the source and drain dopants, p/n junctions 124 are then defined between the source/drain regions and the body 106, as depicted in FIG. 2(f).

Figure 2G:
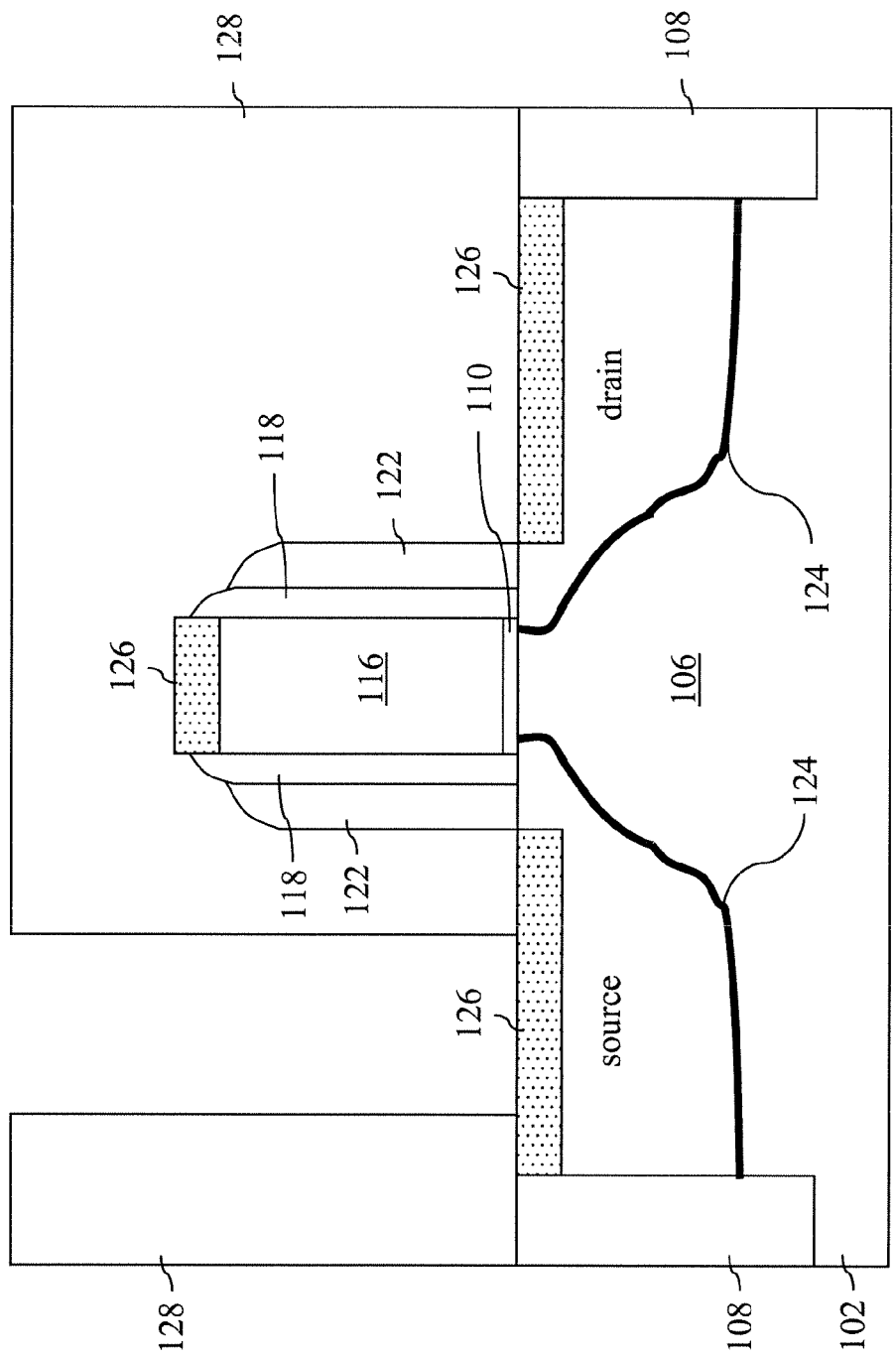

Proceeding to FIG. 2(g), silicide contacts 126 are then formed over the gate 116, as well as the source and drain regions in a manner known in the art. For example, a silicide forming metal such as nickel is formed over the structure, followed by an anneal (e.g., at about 300° C. to about 500° C.) to form NiSi. Thereafter, the unreacted nickel over insulating regions is removed by wet etching. As is the case with the SOI embodiment, after silicidation, a photoresist layer 128 is then formed over the device, and patterned in a manner so as to expose the source area of the device as further shown in FIG. 2(g). Optionally, a thin nitride layer (not shown) can be formed after silicidation to protect the NiSi contacts from the source patterning.

Figure 2H:
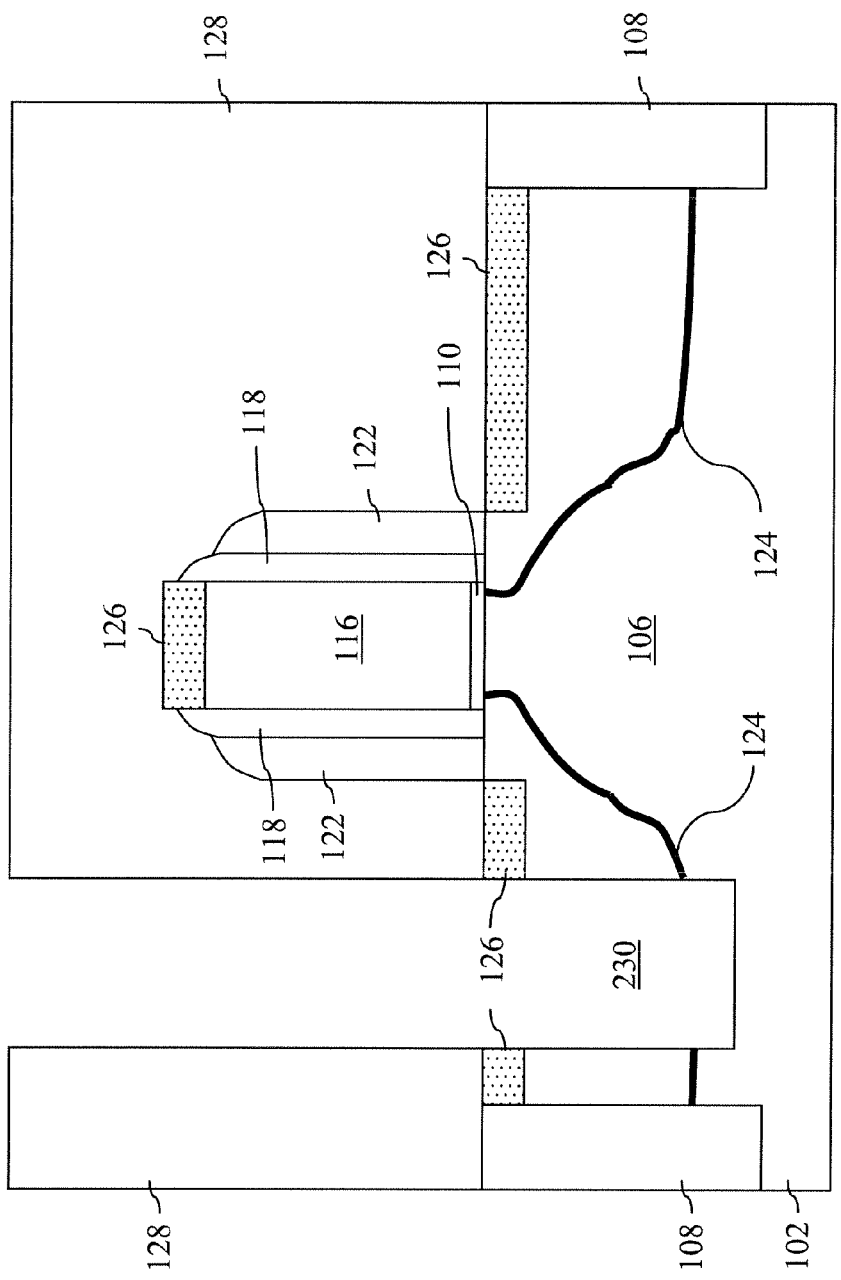

Referring to FIG. 2(h), a multiple step etch is used to remove first the source side NiSi, followed by the doped silicon in the source region. Whereas the SOI embodiment of FIG. 1(j) utilizes a lateral etch through an SiGe region on the source side, the embodiment of FIG. 2(h) extends the vertical etch of the source side doped silicon down through the bottom of the source region, across the source side p/n junction 124 and into the bulk silicon 102, thereby creating cavity 230.

Figure 2I:
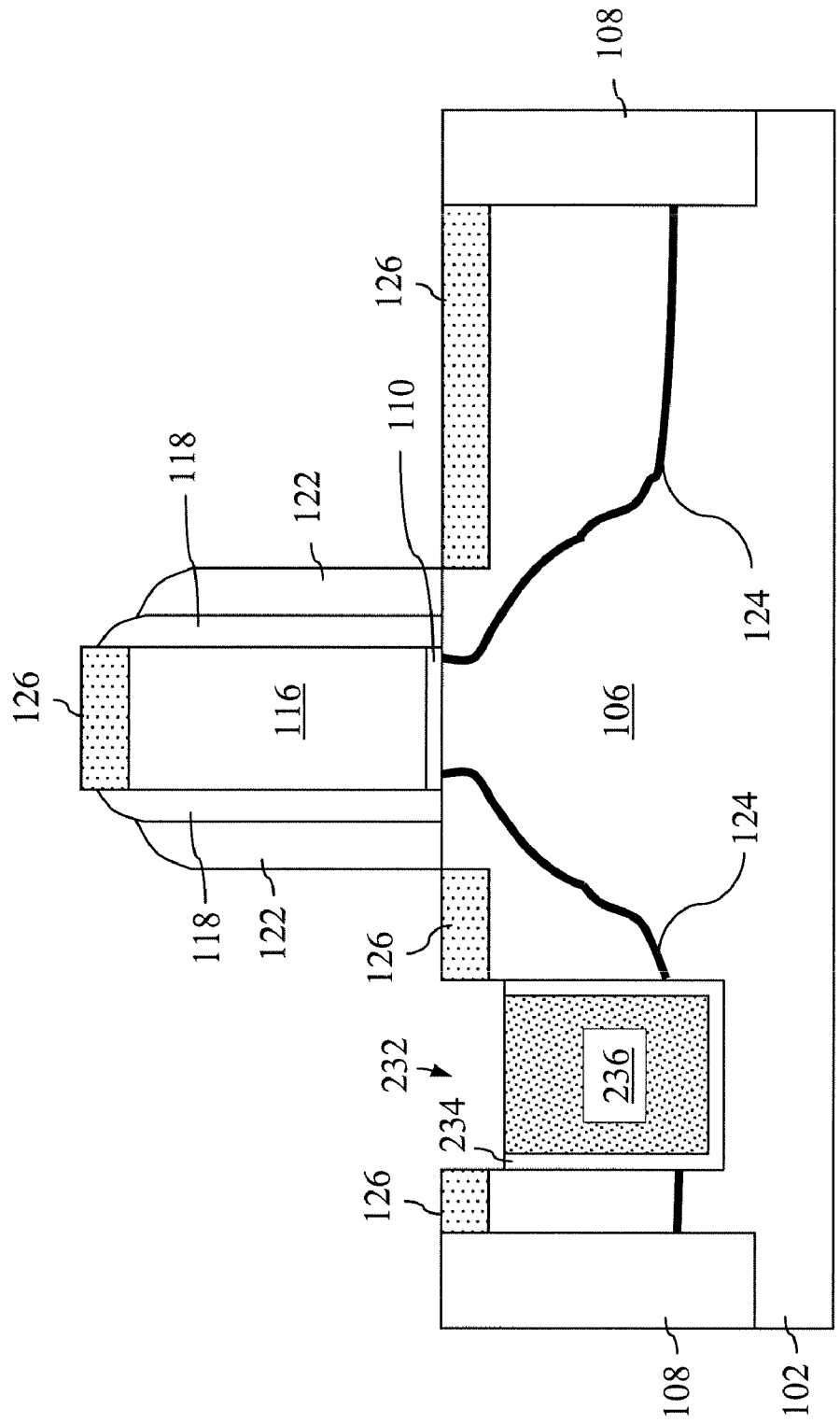

Finally, in FIG. 2(i), a metal plug 232 is then formed within the cavity 230 after removal of the photoresist 128. For example, a thin TiN liner layer 234 is conformally deposited within the source side cavity 230, followed by a deposition and etch-back of a metal plug material 236 such as tungsten (W) to complete the plug 232. Thus configured, the plug 232 provides a source-to-body contact that conducts excess body charge to the source terminal (which is typically connected to ground for an NFET device). Because of the absence of oxide layer, there is sufficient room beneath the source region to allow formation of the cavity (and hence plug 232) in sufficient electrical contact with the bulk silicon 102/body region 106. Following the formation of the plug 232, conventional processing may continue to complete the device (e.g., interlevel dielectric layer formation, via/line formation and other back end of line processes).

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for forming a field effect transistor (FET) device, the method comprising:
   forming a buried insulator layer over a bulk substrate;
   forming a silicon-on-insulator (SOI) layer over the buried insulator layer;
   forming a gate insulating layer over the SOI layer;
   forming source and drain regions in an active device area associated with the SOI layer, the source and drain regions each defining a p/n junction with respect to a body of the active device area;
   forming silicide contacts on a top surface of the source and drain regions; and
   forming a cavity in the source region, across the p/n junction of the source region and into the body, and forming a conductive plug within the cavity, wherein the conductive plug further comprises a titanium nitride (TiN) liner material formed within the cavity and a tungsten (W) metal fill material formed over the liner material;
   wherein the cavity extends through the silicide contact formed on the top surface of the source region, both the cavity and the plug extend vertically down through a bottom portion of the source region and into the SOI layer, and both the cavity and the plug extend laterally across the source region, in a direction toward the drain region, and across the p/n junction of the source region and into the body above the buried insulator layer; and
   wherein the conductive plug facilitates a discharge path between the body and the source region.

2. A method for reducing floating body effects in a silicon-on-insulator (SOI) field effect transistor (FET) device, the method comprising:
   forming a buried insulator layer over a bulk substrate;
   forming a silicon-on-insulator (SOI) layer over the buried insulator layer;
   forming a gate insulating layer over the SOI layer;
   implanting a germanium (Ge) species in at least a source side of the device, so as to create a region of etch selectivity with respect to the SOI layer;
   implanting source and drain halo regions;
   implanting source and drain extension regions;
   forming deep source and drain regions within the SOI layer, the deep source and drain regions each defining a p/n junction with respect to a body of an active device area within the SOI layer; and
   forming a cavity in the source region, across the p/n junction of the deep source region and into the body, and forming a conductive plug within the cavity, wherein the cavity and the plug extend laterally across the deep source region, in a direction toward the deep drain region, and across the p/n junction of the deep source region and into the body above the buried insulator layer;
   wherein the region of etch selectivity facilitates isotropic, lateral etching thereof during the formation of the cavity; and
   wherein the conductive plug facilitates a discharge path between the body and the source region.

* * * * *